United States Patent [19]
Fenk et al.

[11] Patent Number: 5,652,543
[45] Date of Patent: Jul. 29, 1997

[54] AMPLIFIER ARRAY FOR HIGH-FREQUENCY SIGNALS AND MULTIPLEXER CONFIGURATION INCLUDING THE AMPLIFIER ARRAY

[75] Inventors: Josef Fenk, Eching; Helmut Herrmann, München; Stefan Heinen, Krefeld, all of Germany

[73] Assignee: Siemens Aktiengesellschaft, Munich, Germany

[21] Appl. No.: 500,005

[22] Filed: Jul. 10, 1995

[30] Foreign Application Priority Data

Jul. 8, 1994 [DE] Germany .................... 44 24 141.0

[51] Int. Cl.$^6$ ................ H03K 17/56; H03F 3/68
[52] U.S. Cl. .................. 330/51; 330/147; 330/252; 330/295; 330/326; 327/407
[58] Field of Search ................ 330/51, 147, 252, 330/295, 306; 327/407, 411

[56] References Cited

U.S. PATENT DOCUMENTS 3,473,137 10/1969 Stern .
4,274,060 6/1981 Kawanabe ................ 330/51 X
5,045,804 9/1991 Sugawara et al. ............ 30/51
5,237,526 8/1993 Delagrange .

FOREIGN PATENT DOCUMENTS 1226160 10/1966 Germany .
2242089 9/1991 United Kingdom .

Primary Examiner—James B. Mullins
Attorney, Agent, or Firm—Herbert L. Lerner; Laurence A. Greenberg

[57] ABSTRACT

An amplifier array for high-frequency signals includes a differential amplifier with transistors capacitively coupled to the emitters. The differential amplifier therefore has high-pass characteristics. The input signals are each supplied to the differential amplifier through a respective high-pass. This results in an integratable amplifier array with strong damping for base-band signal components and band-pass characteristics for high-frequency useful signal components.

8 Claims, 3 Drawing Sheets

5,652,543

AMPLIFIER ARRAY FOR HIGH-FREQUENCY SIGNALS AND MULTIPLEXER CONFIGURATION INCLUDING THE AMPLIFIER ARRAY

BACKGROUND OF THE INVENTION

Field of the Invention

The invention relates to an amplifier array for high-frequency signals, including a differential amplifier array having at least two transistors with emitters being coupled through a coupling element and base terminals each receiving a signal to be amplified. The invention also relates to a multiplexer configuration having at least one such amplifier array.

In amplifier arrays which have been described heretofore, for instance in the textbook by Tietze and Schenk. entitled: "Halbleiterschaltungstechnik" [Semiconductor Circuitry] 9th edition, 1991, pp. 66–73, differential amplifier stages with or without slight negative resistive feedback of the emitters are used. The input transistors are coupled directly to the input signals.

Those amplifier stages have a disadvantage which is that the amplification is effective over a wide frequency bandwidth. In principle, that bandwidth ranges from the equisignal component to the limit frequency of the amplifier, which is dictated essentially by the parasitic effects of the components. That means that not only the high-frequency useful signal but also low-frequency noise signals in the base band are amplified. Such noise signals can be coupled-in, for instance, as a result of preceding signal processing circuits, logic circuits or leakage pickup. If the amplifier stages are followed by mixers or modulators, then the noise signals in the base band are also superimposed on the useful signal in the carrier band. That is undesirable, since it reduces both the useful-signal-to-noise ratio and the dynamics.

SUMMARY OF THE INVENTION

It is accordingly an object of the invention to provide an amplifier array for HF signals and a multiplexer configuration including the amplifier array, which overcome the hereinafore-mentioned disadvantages of the heretofore-known devices of this general type, which suppress undesired noise components and which essentially only amplify the HF useful signal.

With the foregoing and other objects in view there is provided, in accordance with the invention, an amplifier array for high-frequency signals, comprising a differential amplifier array including: configurations with high-pass characteristics, each configuration having one capacitive element with a first terminal for receiving a signal to be amplified and a second terminal, and an ohmic element having a first terminal connected to the second terminal of the capacitive element and a second terminal for a reference potential; at least two transistors having bases and emitters, the bases of the transistors each being connected to the second terminal of a respective one of the capacitive elements for receiving a respective one of the signals to be amplified; at least one capacitor coupling the emitters of the transistors; a terminal for a first supply potential, and a terminal for a second supply potential; current sources each connecting the emitter of a respective one of the transistors to the terminal for the first supply potential; first and second further current sources connected to the terminal for the first supply potential, a resistor connected between the first further current source and the terminal for the second supply potential, another transistor having an emitter and a collector defining an emitter-to-collector path connected between the second further current source and the terminal for the second supply potential; the other transistor being connected as an emitter follower transistor relative to the resistor; the emitter of the other transistor being a pickup for the reference potential; and the current sources and the further current sources being controllable by a common control signal.

Through the use of the amplifier array according to the invention, signal components below a limit frequency, which is adjustable through the dimensioning of the components, are damped at 40 decibels (dB) per decade. Due to the parasitic effects of the components, there is an upper limit frequency for the amplifier. The amplifier array functions overall as a bandpass filter.

By coupling two signal paths to the capacitively coupled emitters, either upstream of the differential amplifier stage or at the output of these emitters, it is possible in a simple way to attain an analog multiplexer in which one of two HF signals can be connected to the output.

Other features which are considered as characteristic for the invention are set forth in the appended claims.

Although the invention is illustrated and described herein as embodied in an amplifier array for high-frequency signals and a multiplexer configuration including the amplifier array, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
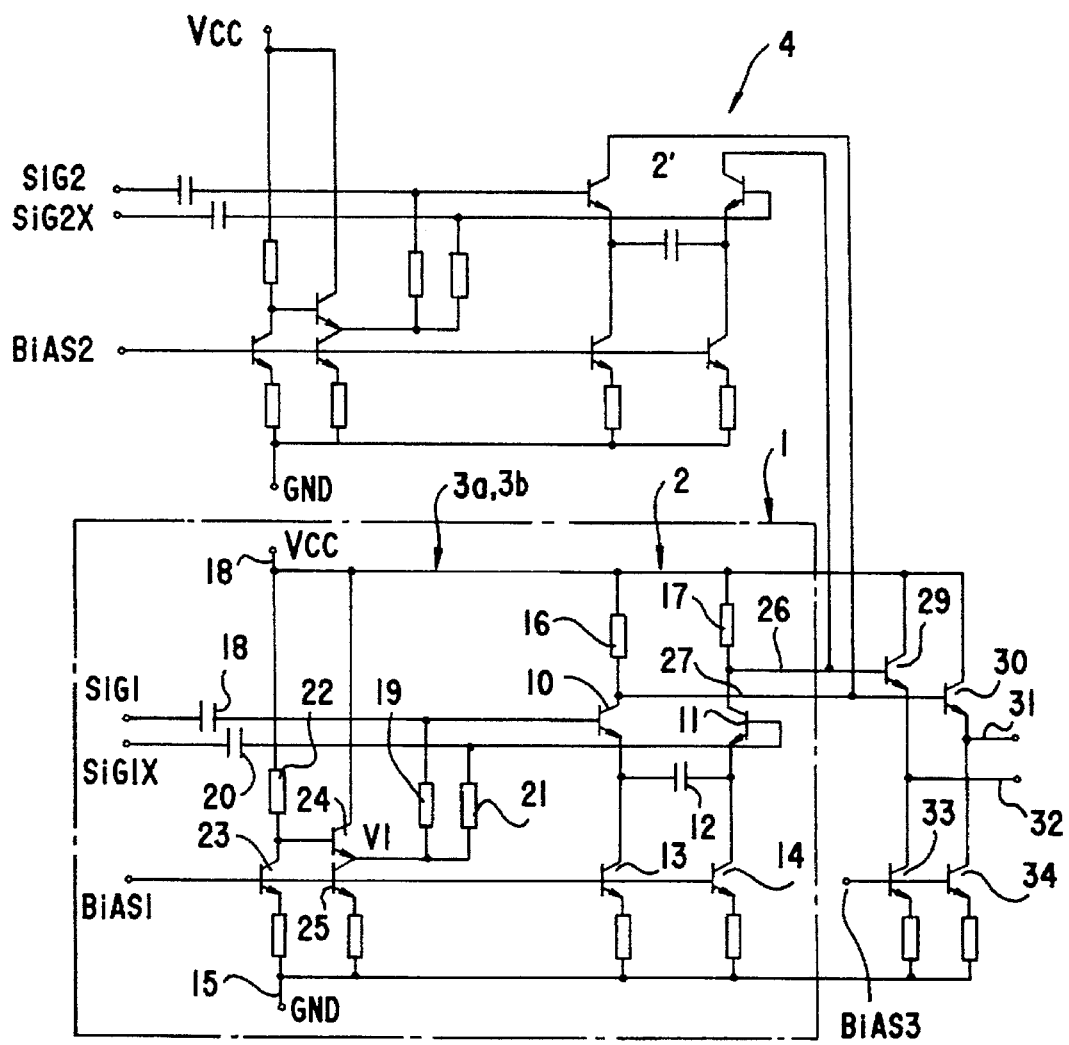
FIG. 1 is a schematic circuit diagram of a first embodiment of an analog multiplexer with two amplifier stages according to the invention.

Referring now to the figures of the drawing in detail and first, particularly, to FIG. 1 thereof, there is seen an analog multiplexer which includes two amplifier stages according to the invention, that are coupled at the output side, for HF signals. An amplifier stage 1, which will be described in detail, includes a differential amplifier 2 with two emitter-coupled transistors 10, 11. Emitters of the transistors 10, 11 are coupled capacitively through a capacitor 12. Each emitter is connected through a current source 13, 14 to a terminal 15 for a ground potential GND. Collectors of the transistors 10, 11 are each connected through a respective operating resistor 16, 17 to a terminal 18' for a positive supply potential VCC. Input signals of the differential amplifier 2, which are fed to base terminals of the transistors 10, 11, are each fed through a respective filter 3a, 3b with high-pass characteristics. The filter 3a, which is connected to the base terminal of the transistor 10, includes a capacitor 18 by way of which an input signal SIG1 is coupled to the base of the transistor 10, and a resistor 19 by way of which a terminal of the capacitor 18 that is connected to the base of the transistor 10 is connected to a reference potential V1. Correspondingly, a signal SIG1X, which is complementary to the signal SIG1, is coupled to the base of the transistor 11 through the high-pass filter 3b, which includes a series capacitor 20 and parallel resistor 21. In order to generate the reference potential V1, a current path including a resistor 22 with a ground-side current source 23 is connected between the potentials VCC and GND. Connected to the resistor 22 is an emitter follower transistor 24, which is connected on the emitter side through a current source 25 to the ground terminal 15. The reference potential V1 can be picked up at the emitter of the transistor 24. The current sources 13, 14 and 23, 25 are preferably connected to a common control potential BIAS1. The reference potential BIAS1 can, for instance, be derived from a reference current through a current/voltage converter.

The amplifier 1 according to the invention functions as described below. The HF useful signals SIG1, SIG1X are filtered through the use of the high-pass filter 3a, so that low-frequency noise signals are damped. The limit frequency of the high-pass filters can be adjusted by suitable dimensioning of the resistors 19, 21. The capacitors 18, 20 have relatively low capacitances, so that they can also be made in integrated form. The signals SIG1, SIG1X that are high-pass-filtered by the filters 3a, 3b trigger the amplifier 2 differentially in the push-pull mode. The capacitive emitter coupling 12 assures that the emitters of transistors 10, 11 are well coupled, at HF signal components. At low-frequency signal components, the emitters of the transistors 10, 11 are virtually uncoupled. Accordingly, the amplifier 2 has high gain for HF signal components and low gain for low-frequency signal components. The differential amplifier 2 having the capacitively coupled emitters thus acts as a further high-pass filter, having a limit frequency which is adjusted through the suitable dimensioning of the operating resistors 16, 17 in conjunction with the capacitor 12. The amplified, twice high-pass-filtered differential signal can be picked up at outputs 26, 27 that are connected to the operating resistors. The useful signal is present in low-resistance form at emitter follower transistors 29, 30, which follow the aforementioned outputs and each have one emitter-side current source 33, 34.

In other words, two respective high-pass filters 3a or 3b, 2, are connected into the input-output signal path of the signals SIG1, SIG1X, so that a damping of 40 dB per decade is obtained for low frequencies. Through the use of the emitter follower transistors 29, 30 and the parasitic elements, particularly the use of the differential amplifier 2, a practical gain up to an upper limit frequency is obtained. Thus the overall circuit is in the nature of a bandpass filter. Since the capacitors 12, 18, 20 which are used have relatively low capacitances, these capacitors can be integrated. The entire circuit can therefore be made in a single integrated circuit, without using discrete components.

In an advantageous application of the amplifier stage, an analog multiplexer can be made, as is shown in FIG. 1, from the amplifier stage 1 and an amplifier stage 4. The amplifier stage 4 receives input signal pairs SIG2, SIG2X and a control voltage BIAS2. One of the push-pull input signal pairs SIG1, SIG1X or SIG2, SIG2X can be connected to outputs 31, 32 of the multiplexer. In the case of the switchover, only one of the control voltages BIAS1 and BIAS2 is switched to be active for the current sources of the various signal paths. The collectors of the transistors of the various differential amplifiers are coupled in such a way that the operating resistors 16, 17 are common to both amplifier stages. The emitter-side current sources of the emitter follower transistors 29, 30 are triggered by a further control potential BIAS3.

Figure 2:
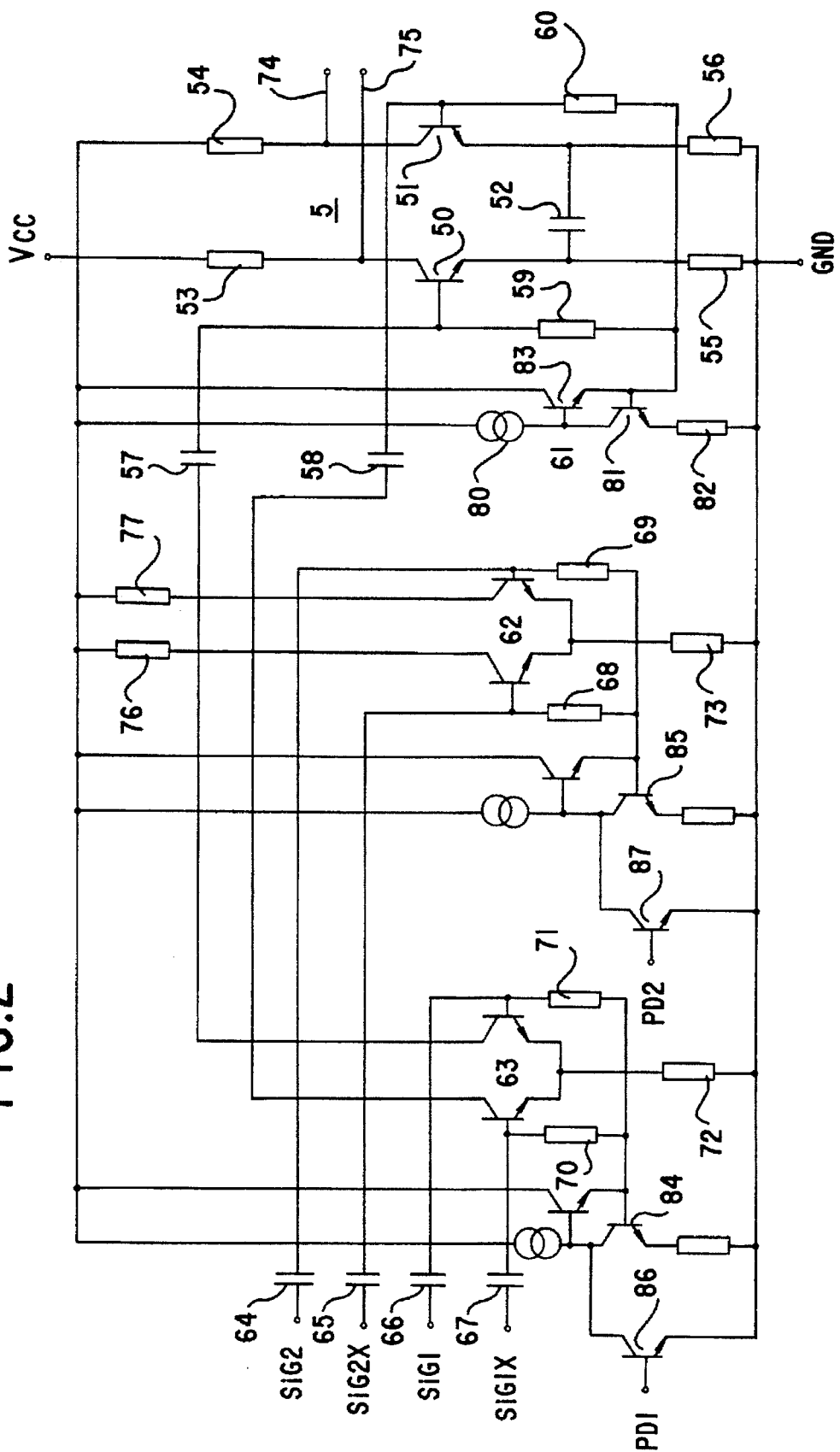
FIG. 2 is a circuit diagram of a second embodiment of an analog multiplexer.

Another embodiment of a multiplexer containing an amplifier stage according to the invention is shown in FIG. 2. One of the differential input signals SIG1, SIG1X or SIG2, SIG2X is connected to push-pull outputs 74, 75 as a function of control signals PD1, PD2. To that end, the signals SIG1, SIG1X are each delivered through a respective high-pass filter 66, 71 or 67, 70 to a first differential amplifier 63. This differential amplifier has transistors that have emitters coupled to one another. Instead of being connected to a current source with an impressed current, the emitters are connected to ground GND through a resistor 72. The signals SIG2, SIG2X are each supplied through a respective high-pass filter 64, 69 or 65, 68 to a second differential amplifier stage 62, having coupled emitters which are connected through a resistor 73 to ground. On the output side, collector branches of the transistors of the differential amplifiers 63, 62 are coupled to a common pair of operating resistors 76, 77. The push-pull signals that can be picked up at the resistors 76, 77 are each supplied through a further high-pass filter 58, 60 or 57, 59 to an output-side differential amplifier (50 . . . 56) with capacitively coupled emitters. The respective output signal terminals 75 and 74, are connected to operating resistors 53, 54 of this differential amplifier. The emitters of this last differential amplifier are also each connected to ground through a respective resistor 55, 56. Since the emitters are connected to ground through resistors 55, 56, 72, 73, instead of being connected to a current source with impressed current, the supply voltage to the entire circuit can be selected to be lower.

In order to adjust the operating point of the high-pass filters, one circuit for each is provided and identified by reference numeral 61. The circuit includes a current source 80, which is connected to the supply potential VCC and is in series with a collector-to-emitter path of a transistor 81 having an emitter-side resistor 82. A base-to-emitter path of a further transistor 83 is connected between the collector and the base of the transistor 81. A reference voltage for adjusting the operating point of the high-pass filters 57, 59 and 58, 60 can be picked up at the emitter of the transistor 83. Reference voltage sources 84, 85 for the remaining high-pass filters are constructed in corresponding fashion. These last reference voltage sources can each be turned off through a respective transistor 86 and 87, at which the respective signals PD1 and PD2 are applied. It is thus possible to select one of the pairs of push-pull signals SIG1, SIG1X or SIG2, SIG2X.

In the multiplexer shown in FIG. 2, three high-pass stages are incorporated into one input-output signal path. Specifically, these are the high-pass filters 67, 70; 66, 71 and 65, 68; 64, 69, the high-pass filters 58, 60 and 57, 59, and the differential amplifier 5 with emitters being coupled through the capacitor 52. In other words, the multiplexer of FIG. 2 can be used especially advantageously for low supply voltages. Even greater damping of 60 dB per decade for the signal components in the base band is achieved.

Figure 3:
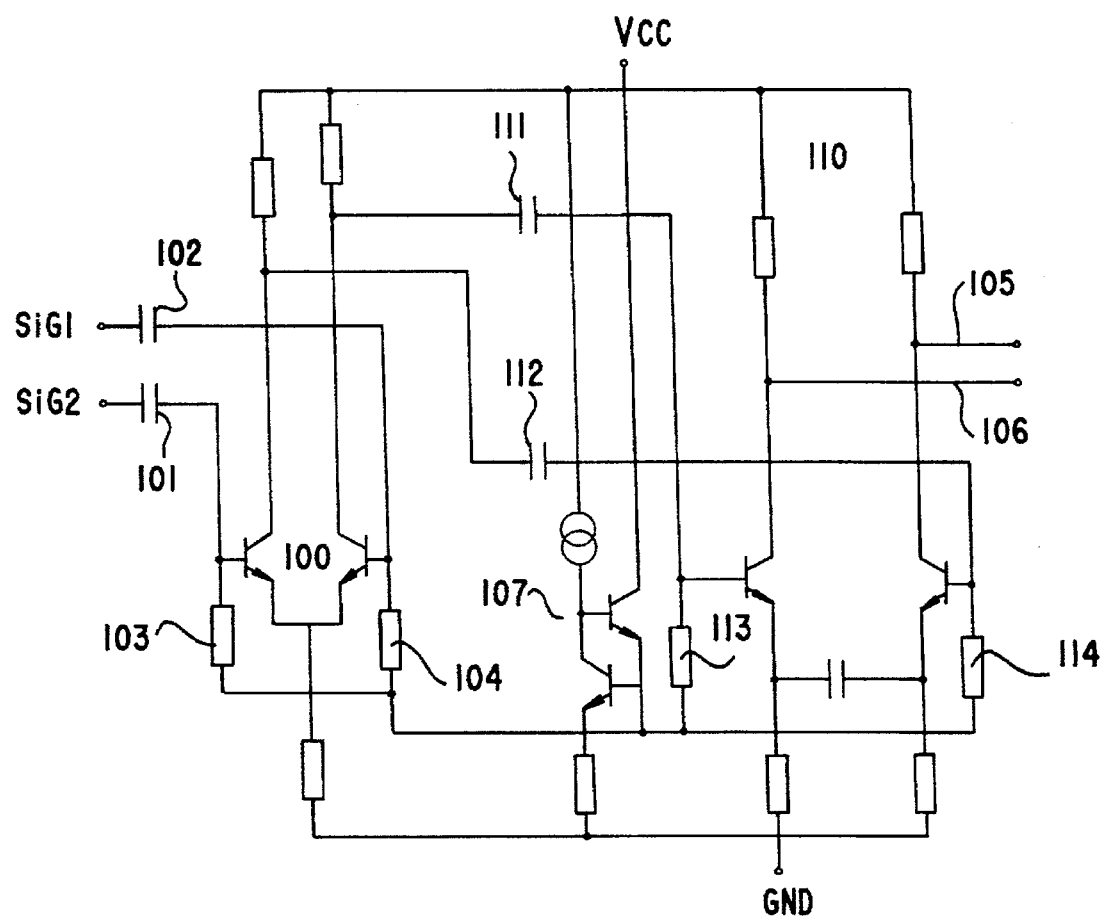
FIG. 3 is a circuit diagram of a third embodiment of an analog multiplexer.

A further embodiment of an analog multiplexer, using an amplifier array according to the invention, is shown in FIG. 3. It differs from the embodiment of FIG. 2 in that instead of push-pull signals, asymmetrical signals SIG1, SIG2 are supplied. To that end, a single differential amplifier 100 is provided preceding an output-side differential amplifier stage 110 with capacitively coupled emitters and preceding high-pass filters 111, 113; 112, 114. The signals SIG1, SIG2 are coupled-in through respective high-pass filter configurations 102, 104 and 101, 103. A single reference voltage generator 107 is provided for adjusting the operating point of all of the RC high-pass filters. One of the filtered signals SIG1, SIG2 can again be picked up as push-pull signals at outputs 105, 106 of the multiplexer. It is required that only one of the signals SIG1 or SIG2 be active at a time. The other must then be switched off. This can be accomplished by suitable circuitry provisions at the circuit input. The corresponding transistor of the differential amplifier 100 is then controlled by a constant signal derived from the reference voltage generator 107. This circuit is suitable as an especially space-saving multiplexer variant for input signals with a high signal-to-noise ratio.

We claim:

1. An amplifier array for high-frequency signals, comprising:
   a differential amplifier array including:
      configurations with high-pass characteristics, each configuration having one capacitive element with a first terminal for receiving a signal to be amplified and a second terminal, and an ohmic element having a first terminal connected to the second terminal of said capacitive element and a second terminal for a reference potential;
      at least two transistors having bases and emitters, the bases of said transistors each being connected to the second terminal of a respective one of said capacitive elements for receiving a respective one of the signals to be amplified;
      at least one capacitor coupling the emitters of said transistors;
      a terminal for a first supply potential, and a terminal for a second supply potential;
      current sources each connecting the emitter of a respective one of said transistors to said terminal for the first supply potential;
      first and second further current sources connected to said terminal for the first supply potential, a resistor connected between said first further current source and said terminal for the second supply potential, another transistor having an emitter and a collector defining an emitter-to-collector path connected between said second further current source and said terminal for the second supply potential;
      said other transistor being connected as an emitter follower transistor relative to said resistor;
      the emitter of said other transistor being a pickup for the reference potential; and
      said current sources and said further current sources being controllable by a common control signal.

2. The amplifier array according to claim 1, wherein the signals to be amplified are signals being complementary to one another.

3. An amplifier array for high-frequency signals comprising
   a differential amplifier array including:
      configurations with high-pass characteristics, each configuration having one capacitive element with a first terminal for receiving a signal to be amplified and a second terminal, and an ohmic element having a first terminal connected to the second terminal of said capacitive element and a second terminal for a reference potential;
      at least two transistors having bases and emitters, the bases of said transistors each being connected to the second terminal of a respective one of said capacitive elements for receiving a respective one of the signals to be amplified;
      at least one capacitor coupling the emitters of said transistors;
      a terminal for a first supply potential, and a terminal for a second supply potential;
      resistors each being connected between the emitter of a respective one of said transistors of said differential amplifier array and said terminal for the first supply potential;
      a first further transistor having a collector into which a current is impressed, a base being a pickup for the reference potential and an emitter;
      a resistor being connected between the emitter of said first further transistor and said terminal for the first supply potential; and
      a second further transistor having a base-to-emitter path being connected between the collector and the base of said first further transistor and having a collector being connected to said terminal for the second supply potential.

4. A multiplexer configuration, comprising:
   two differential amplifier arrays each including:
      configurations with high-pass characteristics, each configuration having one capacitive element with a first terminal for receiving a signal to be amplified and a second terminal, and an ohmic element having a first terminal connected to the second terminal of said capacitive element and a second terminal for a reference potential;
      at least two transistors having collectors, bases and emitters, the bases of said transistors each being connected to the second terminal of a respective one of said capacitive elements for receiving a respective one of the signals to be amplified;
      at least one capacitor coupling the emitters of said transistors;
      a terminal for a first supply potential, and a terminal for a second supply potential;
      current sources each connecting the emitter of a respective one of said transistors to said terminal for the first supply potential;
      first and second further current sources connected to said terminal for the first supply potential, a resistor connected between said first further current source and said terminal for the second supply potential, another transistor having an emitter and a collector defining an emitter-to-collector path connected between said second further current source and said terminal for the second supply potential;
      said other transistor being connected as an emitter follower transistor relative to said resistor;
      the emitter of said other transistor being a pickup for the reference potential; and
      said current sources and said further current sources being controllable by a common control signal;
      other resistors and terminals for an output signal, the collectors of said transistors of said differential amplifier arrays being coupled in pairs and being connected to said other resistors and to said terminals for the output signal.

5. The multiplexer configuration according to claim 4, including outputs of said differential amplifier array, and emitter follower transistors each following at least a respective one of said outputs.

6. A multiplexer configuration, comprising:

a differential amplifier array including:

configurations with high-pass characteristics, each configuration having one capacitive element with a first terminal for receiving a signal to be amplified and a second terminal, and an ohmic element having a first terminal connected to the second terminal of said capacitive element and a second terminal for a reference potential;

at least two transistors having bases and emitters, the bases of said transistors each being connected to the second terminal of a respective one of said capacitive elements for receiving a respective one of the signals to be amplified;

at least one capacitor coupling the emitters of said transistors;

a terminal for a first supply potential, and a terminal for a second supply potential;

a first further differential amplifier array having differential amplifier branches and having outputs each being connected to at least one of said configurations with high-pass characteristics;

a first further configuration with high-pass characteristics;

said first further differential amplifier array having an input side being supplied through said first further configuration with high-pass characteristics with at least the signals to be amplified.

7. The multiplexer configuration according to claim 6, including:

a second further differential amplifier array having differential amplifier branches being coupled in pairs with said differential amplifier branches of said fist further differential amplifier array;

a second further configuration with high-pass characteristics; and said second further differential amplifier array having an input side being controlled through said second further configuration with high-pass characteristics by further signals to be amplified.

8. The multiplexer configuration according to claim 7, including:

two third further transistors each having a collector, an emitter and a base, said collector is fed by said base being a pickup for further reference potentials, each supplied to a respective one of said further configurations with high-pass characteristics and to said further amplifier arrays, two resistors each being connected between the emitter of a respective one of said further transistors and said terminal for the first supply potential;

two fourth further transistors each having a base-to-emitter path being connected between the collector and the base of a respective one of said third further transistors and each having a collectors being connected to said terminal for the second supply potential; and two switching transistors each having an emitter-collector path connected between the collector of a respective one of said two third further transistors and said terminal for the second supply potential.

* * * * *